(12) United States Patent
Slepcevic

(10) Patent No.: US 6,475,878 B1
(45) Date of Patent: Nov. 5, 2002

(54) METHOD FOR SINGULATION OF INTEGRATED CIRCUIT DEVICES

(76) Inventor: Dusan Slepcevic, 6 Via Paradiso, Henderson, NV (US) 89011

( * ) Notice: Subject to any disclaimer, the term of this patent is extended or adjusted under 35 U.S.C. 154(b) by 0 days.

(21) Appl. No.: 09/927,052

(22) Filed: Aug. 9, 2001

(51) Int. Cl.[7] .......................... H01L 21/46; H01L 21/78; H01L 21/301
(52) U.S. Cl. ........................................ 438/460; 83/51
(58) Field of Search .................................. 438/460, 464, 438/465; 225/1, 3, 4, 5; 83/51

(56) References Cited

U.S. PATENT DOCUMENTS

| | | | | |
|---|---|---|---|---|
| 2,510,383 A | * | 6/1950 | Dalgleish ..................... | 154/125 |
| 2,712,169 A | * | 7/1955 | Buttress ........................ | 25/107 |
| 3,585,830 A | * | 6/1971 | Mitchell ....................... | 72/203 |
| 3,595,111 A | * | 7/1971 | Hershberger ................. | 83/175 |
| 3,687,345 A | * | 8/1972 | Carlson et al. ................ | 225/1 |
| 4,235,357 A | * | 11/1980 | Young .......................... | 225/1 |
| 4,352,446 A | * | 10/1982 | Young .......................... | 225/1 |
| 4,846,032 A | * | 7/1989 | Jampathom et al. ....... | 83/425.2 |
| 5,020,271 A | * | 6/1991 | Walker ........................ | 47/21.1 |
| 5,418,190 A | * | 5/1995 | Cholewa et al. ............... | 438/33 |
| 5,458,269 A | * | 10/1995 | Loomis .......................... | 225/2 |
| 5,740,953 A | * | 4/1998 | Smith et al. .................... | 225/1 |
| 5,826,471 A | * | 10/1998 | Iguchi .......................... | 83/216 |
| 6,171,933 B1 | * | 1/2001 | Xu et al. ........................ | 225/5 |

FOREIGN PATENT DOCUMENTS

| | | | | |
|---|---|---|---|---|
| JP | 356134114 A | * | 10/1981 | ..................... 83/51 |
| JP | 358028411 A | * | 2/1983 | ..................... 83/51 |

* cited by examiner

*Primary Examiner*—John F. Niebling
*Assistant Examiner*—Angel Roman
(74) *Attorney, Agent, or Firm*—Jeffrey D. Moy; Harry M. Weiss; Weiss, Moy & Harris, P.C.

(57) ABSTRACT

An improved and more efficient apparatus and method for singulation of integrated circuit array devices. A relatively inexpensive piece of equipment is used for singulation of IC array devices. The equipment has a primary die and a secondary die as main modules. The primary die and the secondary die comprise a top die tool and a bottom die tool having means for protruding, that is generally V-shaped. The protrusions applying pressure for singulation of the IC array devices.

5 Claims, 3 Drawing Sheets

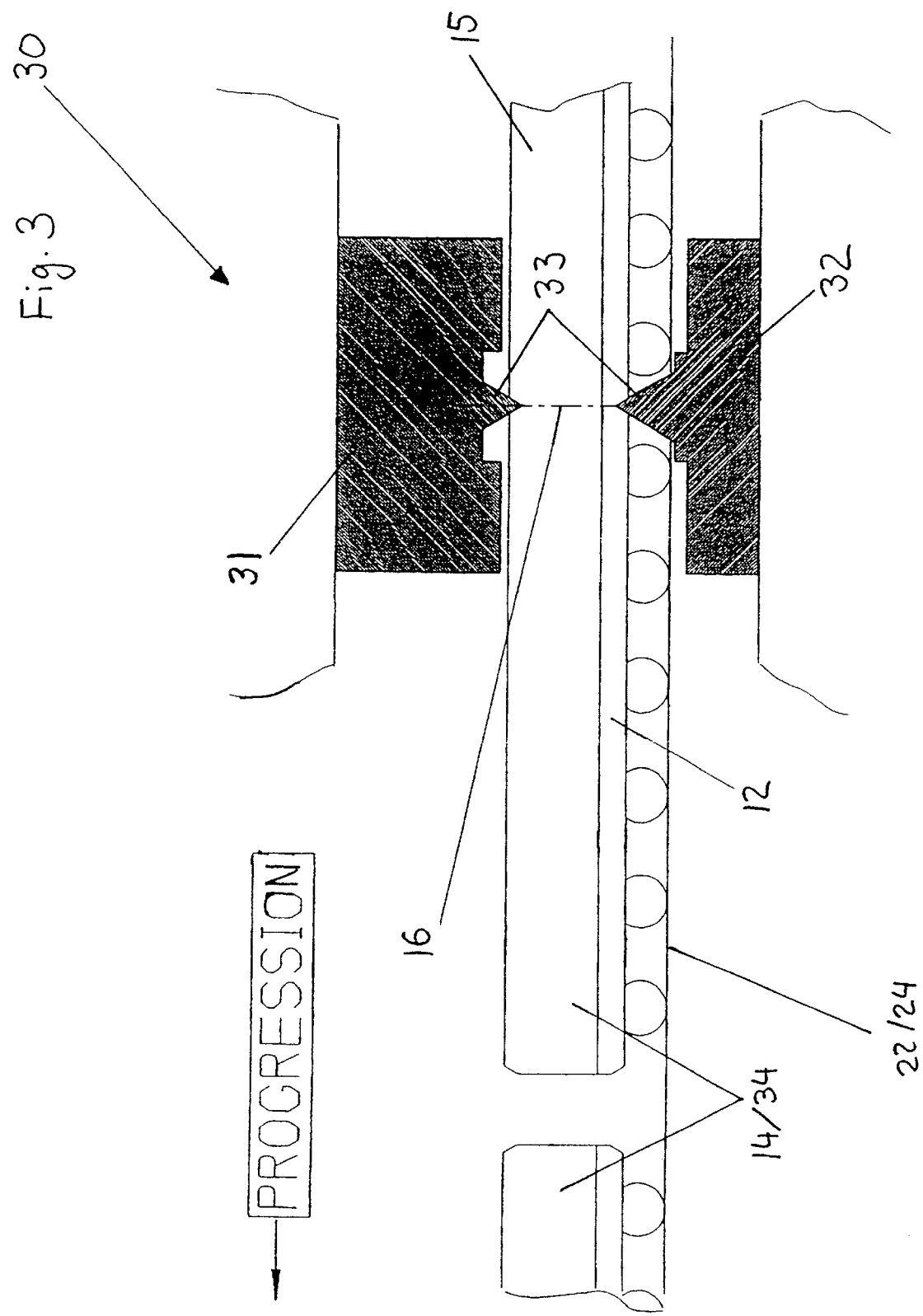

METHOD FOR SINGULATION OF INTEGRATED CIRCUIT DEVICES

BACKGROUND OF THE INVENTION

1. Field of the Invention

This invention relates generally to semiconductor devices and, more specifically, to a method for singulation of integrated circuit devices which are formed in a matrix array.

2. Description of the Prior Art

Integrated circuit devices are typically molded in a matrix array on a thin substrate such as bismaleimide triazine (BT) resin. A semiconductor die is attached to one side of such a substrate and encapsulated by a plastic molding. Contacts such as solder balls and the like are then provided on the opposite side of the semiconductor die. The substrate has many of the characteristics of a printed circuit board, including an upper surface metal layer pattern for a series of bond pads and electrically conductive vias, which penetrate the substrate. The electrically conductive vias connect the metal layer pattern to the solder balls on the lower surface of the substrate. Wire bonding electrically connects the semiconductor die contacts with the bond pads on the substrate. In general, the substrate is fabricated in a row/column format. The subsequent steps of attaching the semiconductor die, wire bonding and encapsulating maintain the row/ column format.

Separation of the various integrated circuit devices into individual components is typically accomplished by a cutting or sawing process often referred to as wet sawing. The wet sawing process has many disadvantages. First, it is not a clean process. Wet sawing produces a slurry which is a combination of liquid and particles from the substrate and/or the encapsulation material. Since the wet sawing process is done after the assembly of the matrix is completed, the slurry may cause contamination. The contamination may lead to lower yields of fully functional semiconductor devices. Furthermore, wet sawing requires the use of a wafer saw. The wafer saw used in the wet sawing process is an expensive tool which has a relatively high operating cost and which takes up a considerable amount of workspace. The wet sawing or cutting process is also a relatively time consuming process.

U.S. patent application Ser. No. 09/583,328, filed May 31, 2000, in the name of Dusan Slepcevic discloses one type of separation technique. The separation technique utilizes a pre-slotted substrate and V-grooves in the encapsulation. The pre-slotted substrate and V-grooves allow the devices to be subsequently broken off more easily. However, this technique may not be applicable for different types of devices.

Therefore a need existed to provide an improved and more efficient method for singulation of semiconductor devices. The improved method needs to provide a slurry free method for singulation of semiconductor devices. The improved method must further provide a method for singulation of semiconductor devices which uses equipment which is relatively inexpensive to build and operate, while taking up a relatively small amount of work space. The improved method must further provide a method for the singulation of semiconductor devices which has a relatively fast throughput and which does not require secondary operations,

SUMMARY OF THE INVENTION

In accordance with one embodiment of the present invention, it is an object of the present invention to provide an improved and more efficient method for the singulation of semiconductor devices.

It is a further object of the present invention to provide a slurry free method for the singulation of semiconductor devices.

It is a still further object of the present invention to provide an improved method for the singulation of semiconductor devices which uses equipment which is relatively inexpensive to build and operate, while taking up a relatively small amount of work space.

It is a still further object of the present invention to provide an improved method for the singulation of semiconductor devices which has a relatively fast throughput and which does not require secondary operations.

BRIEF DESCRIPTION OF THE PREFERRED EMBODIMENTS

In accordance with one embodiment of the present invention, a method for singulation of integrated circuit array devices is disclosed. The method comprises the steps of: providing an integrated circuit (IC) array matrix strip; providing a separation device; applying pressure from a separation device to separate a column from the IC array matrix strip; and applying pressure from the separation device to the separated column to singulate a device from the column.

The foregoing and other objects, features, and advantages of the invention will be apparent from the following, more particular, description of the preferred embodiments of the invention, as illustrated in the accompanying drawing.

BRIEF DESCRIPTION OF THE DRAWINGS

The novel features believed characteristic of the invention are set forth in the appended claims. The invention itself, as well as a preferred mode of use, and advantages thereof, will best be understood by reference to the following detailed description of illustrated embodiments when read in conjunction with the accompanying drawings, wherein like reference numerals and symbols represent like elements.

FIG. 3 is a cross sectional view of a die tool for integrated circuit array singulation.

DETAILED DESCRIPTION OF THE PREFERRED EMBODIMENT

Figure 1:
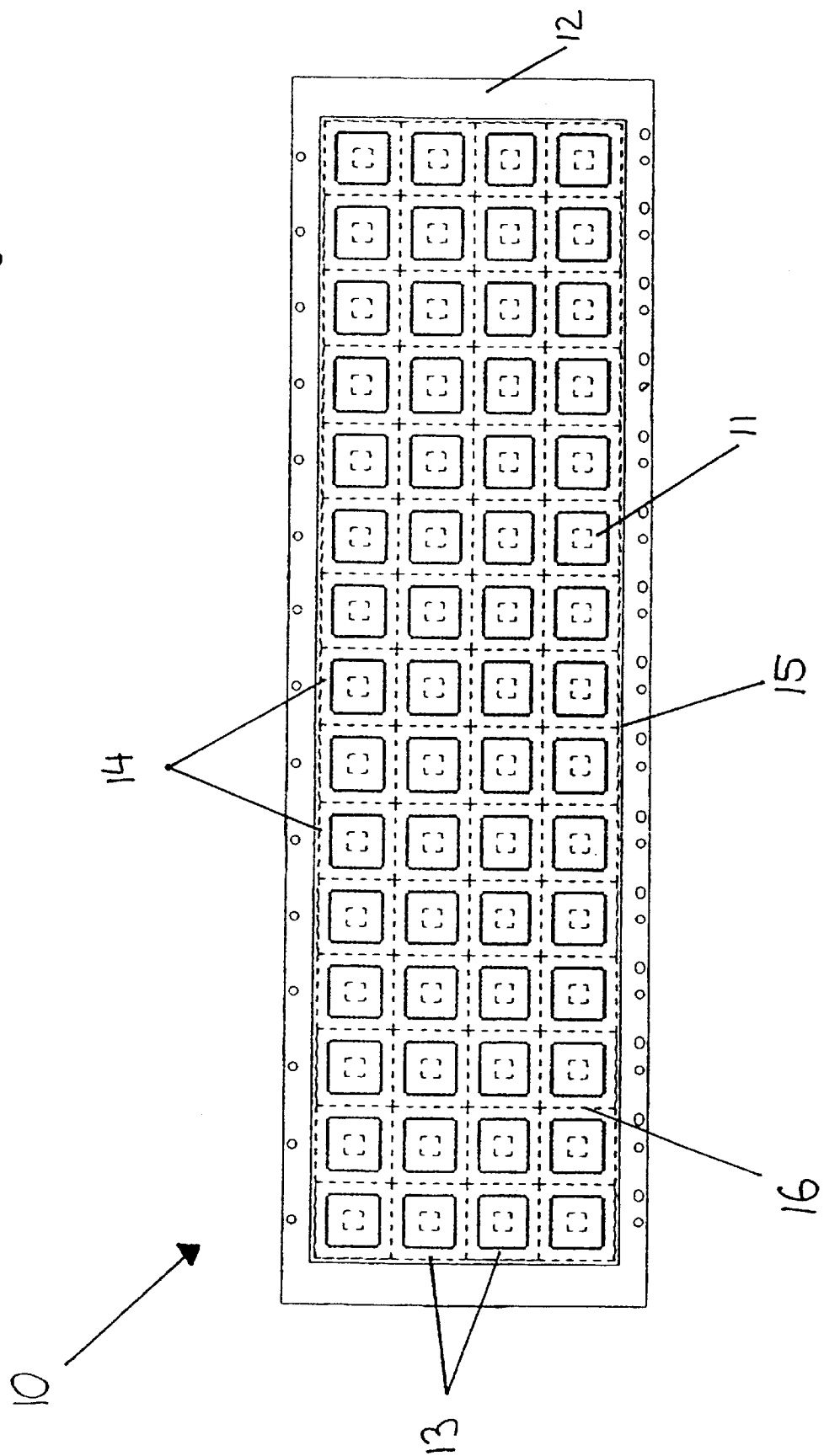
FIG. 1 is a top view of a typical integrated circuit array matrix strip.

Referring to FIG. 1, a top view of a typical integrated circuit matrix array strip 10 (hereinafter IC array strip 10) according to the present invention is shown. The IC array strip 10 may be ball grid array devices, metal leadframe devices, QFN, and the like. It should be noted that the above mentioned are used as an example and should not be seen as to limit the scope of the present invention.

The IC array strip 10 generally comprises semiconductor dies 11 attached to one side of a substrate 12 in an array of four rows 13 and fifteen columns 14. It should be noted that the number of rows and columns is given as an example and should not be seen as to limit the scope of the present invention. A plastic molding 15 encapsulates the semiconductor dies 11. The substrate 12 is generally a bismaleimide triazine (BT) resin. Still referring to FIG. 1, the dotted lines 16 indicate where the completed semiconductor devices will be singulated.

Figure 2:
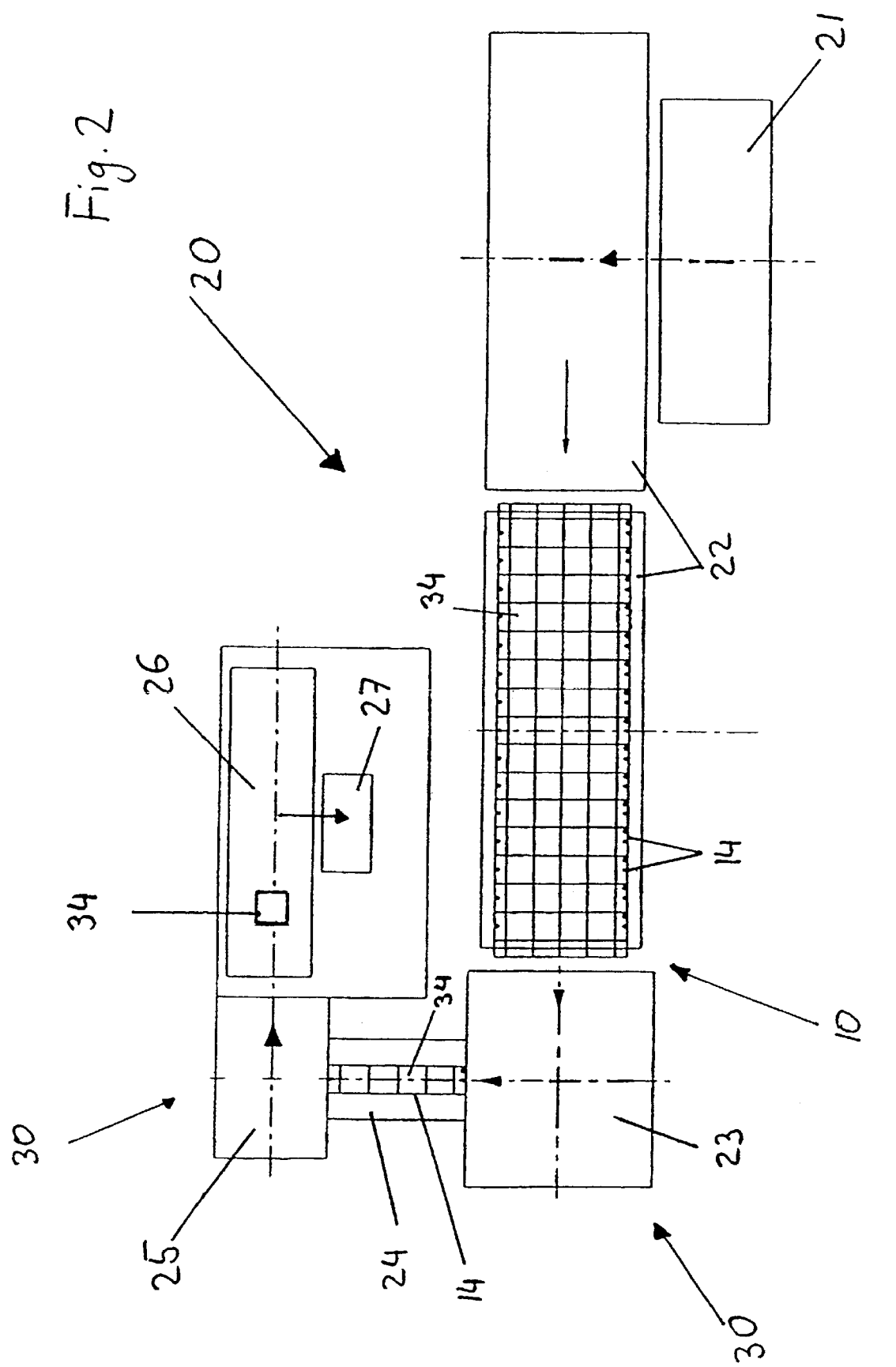
FIG. 2 is a flow diagram of a singulation process and the modular components of an integrated circuit array singulation device.

Referring now to FIG. 2, a flow diagram of the modular components of an IC array singulation device 20 is shown. The IC array singulation device 20 generally comprises a magazine/elevator module 21, a longitudinal feed track 22, a primary die 23, a traverse feed track 24, a secondary die 25, and a pick and placement module 26. The primary die 23 and the secondary die 25 are the main modules used for singulation of IC array devices.

Referring now to FIG. 3, a cross section of a die tool 30 for IC matrix array strip singulation is shown. The die tool 30 generally comprises a top die tool 31 and a bottom die tool 32. Both the top die tool 31 and the bottom die tool 32 have means 33 for protruding the plastic molding 15 and the substrate 12, respectively, as shown in FIG. 3. The means 33 for protruding have preferably a V-shape. It should be noted that for a thin IC array strip 10, a die tool 30 only having a top die tool 31 may be used for singulation.

Now referring to FIGS. 2–3, the IC array strip 10 is fed from the magazine/elevator module 21 (shown in FIG. 2) along the longitudinal feed track 22 to the primary die 23, where it will be positioned. The IC array strip 10 is now positioned between the top die tool 31 and the bottom die tool 32 of the primary die 23 (or between the top die tool 31 and a flat platform if only a single die tool is used). The top die tool 31 and the bottom die tool 32 will be moved towards the IC array strip 10. The means 33 for protruding will apply controlled pressure to the IC array strip 10 between the two adjacent columns 14 along the dotted separation line 16. Pressure will be applied until the separation of a column 14 occurs. The IC array strip 10 progresses through the primary die 23 separating each column 14 of the IC array strip 10. Each separated column 14 advances now via the transverse feed track 24 to the secondary die 25, where again it will be accurately positioned. A separated column 14 is now positioned between the top die tool 31 and the bottom die tool 32 of the secondary die 25.

The top die tool 31 and the bottom die tool 32 will be moved towards the IC array strip 10. The means 33 for protruding will apply controlled pressure to a separated column 14 between two adjacent semiconductor devices 34 along the dotted separation line 16. Pressure will be applied until singulation of the leading device 34 occurs. After each device 34 is singulated, a pick and placement mechanism 26 (shown in FIG. 2) will place the semiconductor device 34 into a placement means 27 (shown in FIG. 2), preferable into a tray or onto a tape depending on the requirement for maintaining the correct orientation of each device 34.

The disclosed method for the singulation of IC array devices uses relatively inexpensive equipment that has relatively low operating costs and that takes up a relatively small amount of workspace. By introducing the top die tool 31 and the bottom die tool 32 with means 33 for protruding the plastic molding 15 and the substrate 12, a clean operation can be realized. The applied controlled pressure to the IC array strip 10 causes a clean break line 16 between the columns 14 and the devices 34. By using the magazine/elevator module 21, the longitudinal feed track 22, the traverse feed track 24, and the pick and placement module 26, a relatively fast throughput is achieved and no secondary operations are required.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A method for singulation of integrated circuit (IC) array devices comprising, in combination, the steps of:

providing an IC array matrix strip;

providing a separation device wherein the separation comprises the steps of:

providing a primary die having a V-shaped top die tool and a V-shaped bottom die tool; and providing a secondary die having a V-shaped top die tool and a V-shaped bottom die tool;

applying pressure from both the V-shaped top die tool and a V-shaped bottom die tool of the primary die to separate a column from said IC array matrix strip; and applying pressure from both the V-shaped top die tool and a V-shaped bottom die tool of the secondary die to said separated column to singulate a device from said column.

2. The method of claim 1 further comprising the steps of:

providing a magazine/elevator module;

providing a longitudinal feed track;

providing a traverse feed track; and providing a pick and placement module.

3. The method of claim 2 further comprising the steps of:

feeding said IC array matrix strip from said magazine/elevator module along said longitudinal feed track to said primary die; and position said IC array matrix strip between said top die tool and said bottom die tool of the primary die.

4. The method of claim 3 further comprising the step of feeding said separated column along said traverse feed track to said secondary die.

5. The method of claim 4 further comprising the step of placing said singulated device into a placement means with said pick and placement module.

* * * * *